United States Patent
Suzuki et al.

(10) Patent No.: US 9,082,715 B2
(45) Date of Patent: Jul. 14, 2015

(54) SUBSTRATE POLISHING APPARATUS

(71) Applicant: Toho Engineering Co., Ltd., Yokkaichi-shi (JP)

(72) Inventors: Tatsutoshi Suzuki, Yokkaichi (JP); Eisuke Suzuki, Yokkaichi (JP); Daisuke Suzuki, Yokkaichi (JP)

(73) Assignee: TOHO ENGINEERING CO., LTD., Yokkaichi-Shi (JP)

( * ) Notice: Subject to any disclaimer, the term of this patent is extended or adjusted under 35 U.S.C. 154(b) by 0 days.

(21) Appl. No.: 13/968,623

(22) Filed: Aug. 16, 2013

(65) Prior Publication Data

US 2014/0051249 A1 Feb. 20, 2014

(30) Foreign Application Priority Data

Aug. 20, 2012 (JP) .................................. 2012-181568

(51) Int. Cl.
*H01L 21/306* (2006.01)
*B24B 37/30* (2012.01)
*B24B 57/02* (2006.01)

(52) U.S. Cl.
CPC .......... *H01L 21/30625* (2013.01); *B24B 37/30* (2013.01); *B24B 57/02* (2013.01)

(58) Field of Classification Search
USPC .......................... 156/345.12, 345.14, 345.18
See application file for complete search history.

(56) References Cited

U.S. PATENT DOCUMENTS

| | | | |
|---|---|---|---|
| 6,517,667 B1 * | 2/2003 | Nakayoshi | ............... 156/345.12 |
| 6,527,625 B1 * | 3/2003 | Kajiwara et al. | ................ 451/41 |
| 6,540,590 B1 | 4/2003 | Kajiwara et al. | |
| 6,719,618 B2 * | 4/2004 | Homma et al. | ............... 451/286 |
| 6,881,134 B2 * | 4/2005 | Brown | ........................... 451/285 |
| 2001/0010305 A1 * | 8/2001 | Takahashi | ....................... 216/89 |
| 2003/0119425 A1 | 6/2003 | Suzuki | |
| 2004/0198056 A1 | 10/2004 | Suzuki | |
| 2004/0198199 A1 | 10/2004 | Suzuki | |
| 2004/0198204 A1 | 10/2004 | Suzuki | |
| 2004/0209551 A1 | 10/2004 | Suzuki | |
| 2006/0137170 A1 | 6/2006 | Suzuki | |
| 2006/0154577 A1 | 7/2006 | Suzuki | |
| 2007/0032182 A1 | 2/2007 | Suzuki | |
| 2008/0064311 A1 | 3/2008 | Suzuki | |
| 2010/0147463 A1 * | 6/2010 | Yamauchi et al. | ........ 156/345.12 |
| 2010/0176089 A1 * | 7/2010 | Delamarche et al. | ........... 216/90 |
| 2011/0319000 A1 | 12/2011 | Suzuki et al. | |

(Continued)

FOREIGN PATENT DOCUMENTS

| | | |
|---|---|---|
| JP | 2004-017229 | 1/2004 |
| JP | 2006-114632 | 4/2006 |
| JP | 2010-205796 | 9/2010 |

*Primary Examiner* — Sylvia R MacArthur

(74) *Attorney, Agent, or Firm* — J-TEK Law PLLC; Jeffrey D. Tekanic; Scott T. Wakeman

(57) ABSTRACT

A substrate polishing apparatus includes a retainer for holding a substrate and substrate rotating device that spins the retainer around a first rotational axis perpendicular to a to-be-polished surface of the substrate. A platen includes an abrasive pad disposed opposite of the to-be-polished surface of the substrate. A platen rotating device spins the platen around a second rotational axis perpendicular to the abrasive pad. A liquid storage chamber includes a wall portion surrounding the outer periphery of the substrate. One end of the wall portion is positionable in a liquid-tight manner with the abrasive pad to define a liquid storage space for retaining a polishing liquid around the outer periphery of the substrate.

24 Claims, 3 Drawing Sheets

(56) References Cited

U.S. PATENT DOCUMENTS

| | | |
|---|---|---|
| 2012/0003903 A1 | 1/2012 | Suzuki et al. |
| 2012/0244649 A1* | 9/2012 | Sano et al. ............ 438/17 |
| 2013/0029566 A1 | 1/2013 | Suzuki et al. |
| 2014/0051249 A1* | 2/2014 | Suzuki et al. ........ 438/692 |

\* cited by examiner

SUBSTRATE POLISHING APPARATUS

CROSS-REFERENCE

The present application claims priority to Japanese patent application no. 2012-181568 filed on Aug. 20, 2012, the contents of which are entirely incorporated herein by reference.

FIELD OF THE INVENTION

The present invention relates to a substrate polishing apparatus and to a method of using the same, for example, to polish a substrate, such as a semiconductor wafer, while undergoing a chemical reaction.

DESCRIPTION OF THE RELATED ART

To polish a semiconductor substrate (wafer), two types of polishing techniques have traditionally been used, for example, (i) grinding and polishing, in which a substrate surface is polished with a grindstone, and (ii) lapping and polishing, in which a more planar or flat surface can be realized than with grinding and polishing by using free abrasive grains. These types of mechanical polishing have difficulty, however, to achieve flatness (planarity) at an atomic level and excellent surface crystallinity. Hence, chemical polishing, such as wet etching and plasma etching, have been used in recent years. In addition, an elastic emission machining (EEM) method has been the focus of attention as a polishing method that is capable of achieving excellent surface crystallinity with higher accuracy.

SiC, GaN and the like have a wide bandgap and superior electrical properties and therefore, have been drawing attention as substrate materials for power devices. However, it is time consuming to use the EEM method to polish a substrate made of SiC or the like due to its high mechanical hardness and chemical stability. As a result, "catalyst-assisted chemical polishing" has been proposed, in which a catalyst, such as platinum, is brought into contact with or close to a surface of the semiconductor substrate made of SiC or the like in the presence of a hydrofluoric acid solution to efficiently etch and polish the substrate surface.

As shown in FIG. 3, a known substrate polishing apparatus generally includes an abrasive pad 92 adhered to a rotatable platen 91. A substrate (wafer) 94 to be polished is held on a rotatable retainer 93 and is pressed against the abrasive pad 92 while a polishing liquid L is dropped onto it from a polishing liquid supply pipe 95 such that the polishing liquid L can penetrate between the abrasive pad 92 and the substrate 94. In this case, the polishing liquid L continuously drains off the abrasive pad 92.

Japanese Laid-Open Patent Publication No. 2010-205796 describes an example of such a known substrate polishing apparatus.

SUMMARY OF THE INVENTION

However, it is highly preferable to minimize the amount of polishing liquid that is used, in particular when an expensive polishing liquid, e.g., containing diamond abrasive grains, is used to perform chemical-mechanical polishing (CMP). In addition, hydrofluoric acid may be used as the polishing liquid in catalyst-assisted chemical polishing and it is both relatively expensive and harmful to humans, such that it is necessary to not only minimize the amount of polishing liquid that is used, but also to take additional safety precautions when handling the polishing liquid. These requirements tend to reduce work efficiency and increase the cost of the ventilating apparatus that is necessary to avoid releasing harmful vapors into the work environment.

It is therefore an object of the present teachings to disclose a substrate polishing apparatus that is capable of efficiently and/or cost-effectively performing chemical polishing on substrates, preferably while using a reduced amount of polishing liquid as compared to known polishing techniques.

According to a first aspect of the present teachings, a substrate polishing apparatus may include a substrate supporting member for holding a substrate; substrate rotating means for spinning the substrate supporting member around a rotational axis perpendicular to a to-be-polished surface of the substrate; a platen having a platen surface disposed opposite of the to-be-polished surface of the substrate; platen rotating means for spinning the platen around a rotational axis perpendicular to the platen surface; and a liquid storage chamber including a wall portion surrounding the outer periphery of the substrate, one end of the wall portion being positionable in a liquid-tight manner (e.g., either close (proximal) to or in abutment) with the platen surface to define a liquid storage space for retaining a polishing liquid around the outer periphery of the substrate.

According to the first aspect of the present teachings, it is possible to supply only the minimum necessary amount of polishing liquid into the liquid storage space formed on the platen around the outer circumference of the substrate, which allows chemical polishing to be performed with the polishing liquid trapped between the surface of the substrate and the platen surface of the platen and retained in the radially outer direction by the wall portion, which extends vertically from the platen surface. Consequently, chemical polishing can be efficiently and economically performed on the substrate with a small amount of polishing liquid, because the polishing liquid does not drain off of the platen surface as is the case in known substrate polishing apparatuses. The substrate polishing apparatus according to the first aspect of the present teachings can be particularly advantageously used for catalyst-assisted chemical polishing, in which, for example, an expensive polishing liquid containing diamond abrasive grains, or an expensive and poisonous substance such as hydrofluoric acid or the like, is used as the polishing liquid.

In a second aspect of the present teachings, the liquid storage chamber includes, or is defined in part by, a stationary axis supporting member for rotatably holding a spindle of the substrate rotating means. The stationary axis supporting member is integrally connected with the wall portion.

In the second aspect of the present teachings, the liquid storage chamber is defined in part by the stationary axis supporting member, which makes it possible to reliably define the liquid storage space.

In a third aspect of the present teachings, the liquid storage chamber includes, or is defined in part by, a biasing member that urges the one end of the wall portion into abutment on the platen surface at a constant pressure.

According to the third aspect of the present teachings, it is possible to reliably ensure that the liquid storage space is enclosed or sealed in a liquid-tight manner.

In a fourth aspect of the present teachings, the substrate polishing apparatus further comprises a sealing member enclosing the liquid storage space from above.

According to the fourth aspect of the present teachings, the liquid storage space is enclosed by the sealing member. Consequently, it is possible to effectively suppress the release of the polishing liquid into the atmosphere, which allows the ventilating apparatus to be simplified and/or to be designed/ operated in a less costly manner. The substrate polishing apparatus according to the fourth aspect of the present teachings can be particularly advantageously used for catalyst-assisted chemical polishing with a polishing liquid, such as hydrofluoric acid, that is harmful to humans.

In a fifth aspect of the present teachings, the substrate polishing apparatus further comprises a liquid distribution pipe for supplying the polishing liquid into the liquid storage space and for recovering polishing liquid from the liquid storage space.

According to the fifth aspect of the present teachings, the polishing liquid can be supplied to the liquid storage space through the liquid distribution pipe during the polishing operation; then, after completion of the polishing operation, polishing liquid that is not consumed during the polishing operation can be recovered (removed) from the liquid storage space through the liquid distribution pipe. Consequently, the substrate polishing apparatus can be operated in a cost-effective manner because the recovered polishing liquid can be reused. In addition, it is possible to reduce the amount of work necessary to supply and recover the polishing liquid.

According to another aspect of the substrate polishing apparatus of the present teachings, it is possible to efficiently and/or cost-effectively perform catalyst-assisted chemical polishing on substrates with a reduced amount of polishing liquid.

DETAILED DESCRIPTION OF THE PREFERRED EMBODIMENTS

The embodiments described below are intended to be illustrative only, such that a wide variety of design changes, alterations and improvements may be made without departing from the gist of the present teachings and thus such modifications also fall within the scope of the present invention. Although the below-described embodiments provide examples in which the present teachings are applied, in particular, to catalyst-assisted chemical polishing, the present teachings are widely applicable to other polishing methods, such as e.g., chemical-mechanical polishing.

Figure 1:
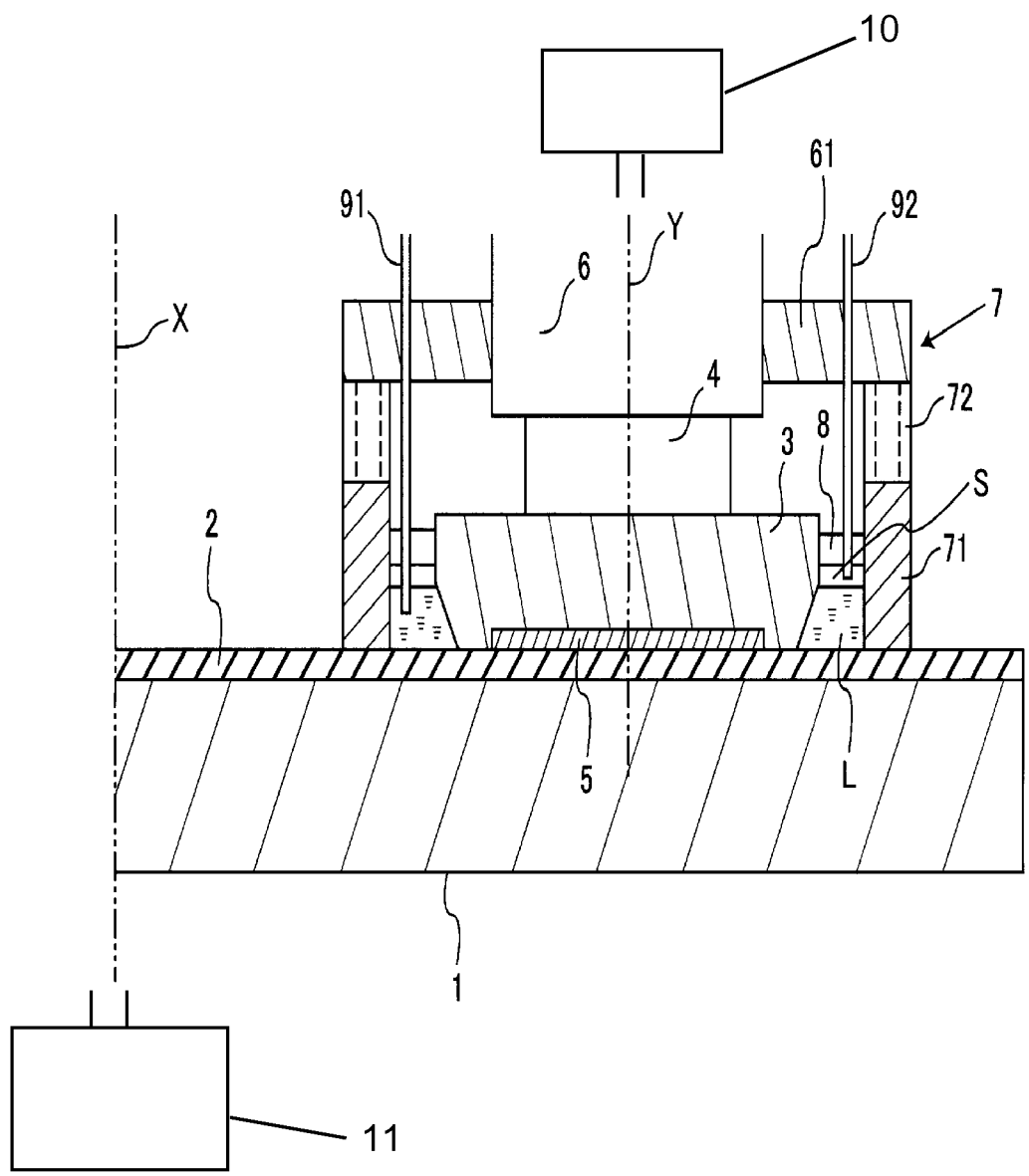
FIG. 1 is a schematic cross-sectional view illustrating the principal parts of a substrate polishing apparatus according to one embodiment of the present teachings.

FIG. 1 is a schematic cross-sectional view illustrating the principal parts of an exemplary substrate polishing apparatus according to the present teachings. In FIG. 1, a platen 1 is provided in the form of a large-diameter circular plate that is spinnable (rotatable) in a horizontal plane (position) around a vertical rotational axis X by using a known drive mechanism, such as an electric motor, which serves as a platen rotating means 11. An abrasive pad 2 is bonded or adhered to an upper surface of the platen 1 and thus forms or defines the upper platen surface of the platen 1. In the present exemplary embodiment, the abrasive pad 2 comprises a circular rubber pad (base) with a platinum thin film formed (disposed) on the upper surface of the rubber pad.

A retainer 3 serves as a substrate supporting (holding) member and is eccentrically located relative to the platen 1. The retainer 3 is also rotatable or spinnable in a horizontal plane (position) around the vertical rotational axis Y of the spindle 4. The vertical rotational axis X of the platen 1 is radially (horizontally) offset from the vertical rotational axis Y of the retainer 3.

A substrate 5 to be polished, such as a semiconductor wafer made of SiC or the like, may be held on the lower surface of the retainer 3 by using any known retaining device. A representative, non-limiting example of the retainer 3 will be described below. During the polishing operation, the lower surfaces of the retainer 3 and the substrate 5 contact the upper surface of the abrasive pad 2.

A support flange 61 radially (horizontally) projects from an outer circumference of a spindle sleeve 6 that holds the spindle 4 and rotatably drives the spindle 4. A spring member 72 serves as a biasing member and has a structure that will be described in further detail below. The spring member 72 is disposed around the entire lower-surface circumference of the support flange 61 and may be generally in the form of a compression spring.

The upper end face of a ring-shaped (annular) wall portion 71 is fixedly (firmly) attached to the lower end of the spring member 72. The lower end face of the wall portion 71 is urged and brought into close contact with the upper surface of the abrasive pad 2 by the biasing force of the spring member 72. As will be further discussed below, the spring member 72 and the wall portion 71 form or define at least a portion of a liquid storage device (chamber) 7.

A generally annular liquid storage space S is bounded in the radially outer direction by the wall portion 7. The annular liquid storage space S is bounded, and in contact with, the abrasive pad 2 on the lower side in the vertical or axial direction. Furthermore, in the radially inward direction, the annular liquid storage space S is bounded by the retainer 3, which holds the substrate 5. In addition, a sealing member (seal) 8 optionally may be disposed between the outer circumference of the retainer 3 and the inner circumference of the wall portion 7 to enclose the liquid storage space S in the vertically- or axially-upper direction.

Terminal ends of a liquid distribution (supply) pipe 91 and an outside air distribution (ventilation) pipe 92 are inserted into the liquid storage space S from above. A specific amount of polishing liquid L, such as hydrofluoric acid, can be supplied into the liquid storage space S via the liquid distribution pipe 91 during the polishing operation. At this time, air within the liquid storage space S is exhausted or vented via the outside air distribution pipe 92 so as to maintain pressure equilibrium inside the liquid storage space S.

Optionally, valves may be fitted onto the liquid distribution pipe 91 and outside air distribution pipe 92 and may be closed during the polishing operation, which will serve to advantageously retain the polishing liquid L inside the liquid storage space S. After the completion of the polishing operation, the polishing liquid L may be suctioned and recovered through the liquid distribution pipe 91. Simultaneously, outside air is permitted to flow into the liquid storage space S via the outside air distribution pipe 92.

Figure 2:
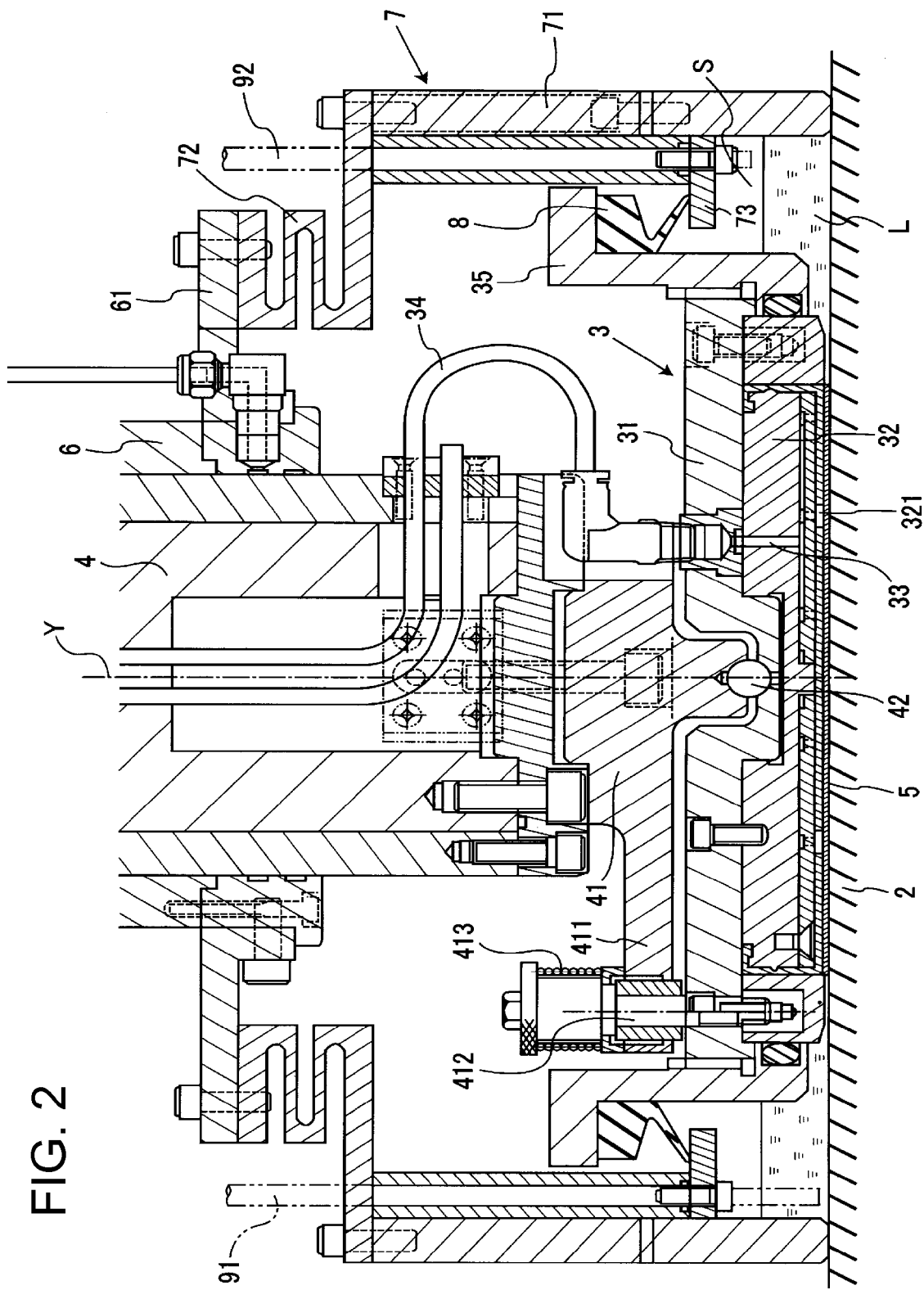
FIG. 2 is a detailed cross-sectional view illustrating the principal parts of the substrate polishing apparatus according to the another embodiment of the present invention.
Figure 3:
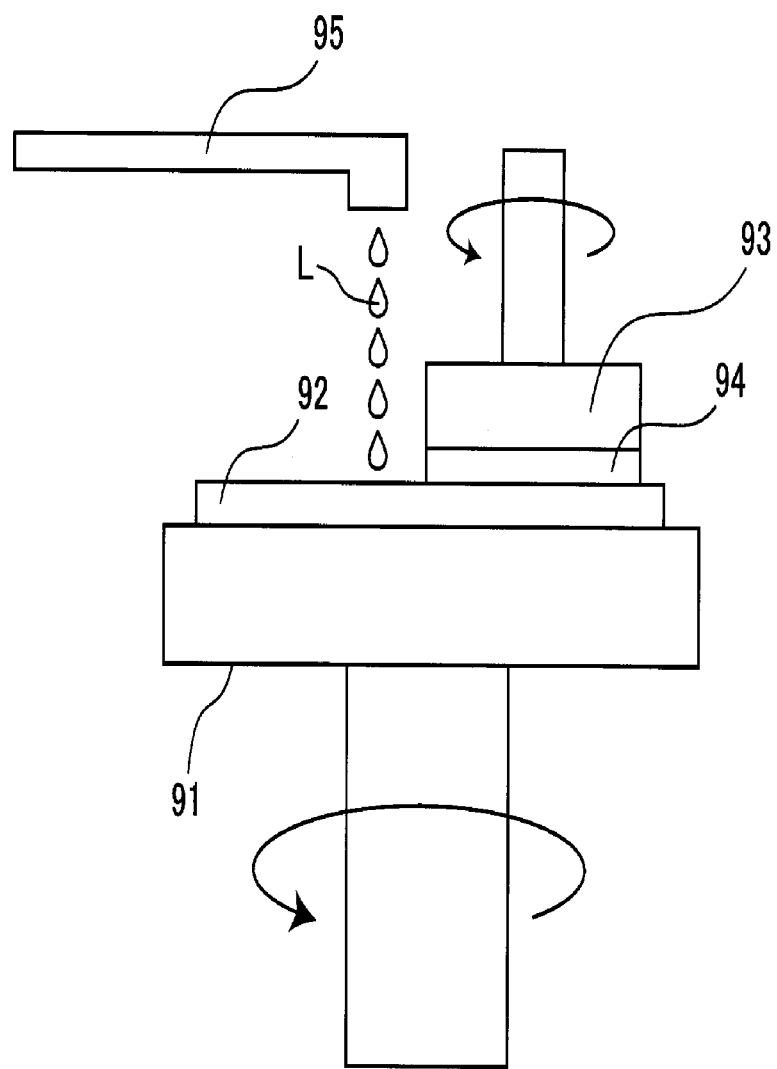
FIG. 3 is a schematic side view illustrating a known substrate polishing apparatus.

FIG. 2 is a detailed cross-sectional view illustrating the principal parts of a more detailed embodiment of the substrate polishing apparatus according to the present teachings. In FIG. 2, the retainer 3 comprises a retainer plate 32 having a multi-tiered (stepped) structure that is fitted within a lower inner circumferential portion of a plate-like base body 31. A ring-shaped (annular) outer frame 35 is disposed around the outer circumference of the base body 31.

A plurality of discrete openings 321 for negative-pressure suctioning penetrate through the retainer plate 32. These openings 321 are in communication with an intake passage 33 formed in the retainer plate 32 and the base body 31. One end of an intake pipe 34 is connected to the intake passage 33 and leads to a not-shown exhaust system (e.g., vacuum pump) located inside the upper end of the spindle 4. The intake pipe 34 extends through a central portion of the spindle 4. The semiconductor substrate 5 is suctioned and held against the lower surface of the retainer plate 32 by the negative pressure communicated from the intake passage 33 via the openings 321. The lower surface (surface to be polished) of the substrate 5 is placed in contact with the upper surface of the abrasive pad 2 during the polishing operation.

The spindle 4 vertically penetrates through the tubular spindle sleeve 6 when oriented in the upright position and is spun or rotated around the rotational axis Y by a drive mechanism, such as an electric motor or other rotating drive means, serving as the substrate rotating means 10 (shown in FIG. 1). A holding member 41 is attached to the lower end of the spindle 4 and protrudes vertically downward from the spindle sleeve 6. The lower surface of the central part of the holding member 41 is positioned on the base body 31 of the retainer 3 by a spherical body 42, such that the holding member 41 is tiltable relative to the base body 31.

A plurality of support arms 411 (only one of which is shown in FIG. 2) extends radially (horizontally) outward from the central part of the holding member 41. The lower end of a holding piece 412 provided on the leading or terminal end of each support arm 411 is urged to abut on the upper surface of the base body 31 by the biasing force of a spring member 413. Consequently, when the spindle 4 is spun, the retainer 3 and the semiconductor substrate 5 held by the retainer are spun accordingly.

The support flange 61 is fixed in a horizontal position around the entire outer circumference of the lower end of the spindle sleeve 6. The upper end of the ring-shaped (annular) spring member 72 is fixedly (firmly) attached to the outer-circumferential lower surface of the support flange 61.

In the present exemplary embodiment, the peripheral wall of the spring member 72 bends alternately radially (horizontally) inward and outward in a generally accordion- or bellow-shape. Therefore, the spring member 72 can expand (elongate) and contract in the vertical direction to generate a biasing force, e.g., in the manner of a compression spring.

The lower end of the spring member 72 is fixedly (firmly) attached to the upper end of the ring-shaped (annular) wall portion 71. Since the spring member 72 has such a configuration or shape, it is less likely to be deformed in the radial (horizontal) direction, which effectively suppresses lateral fluctuations (movements) of the wall portion 71 in the horizontal direction. Because the upper and lower ends of the ring-shaped spring member 72 are fixedly (firmly) attached to the support flange 61 and the wall portion 71, respectively, this configuration also results in an air-tight enclosure of the space surrounded by the wall portion 71 below the spring member 72. Accordingly, the sealing member 8 is optional in this embodiment.

During the polishing operation, the lower end face of the wall portion 71 is brought into abutment with the upper surface of the abrasive pad 2 at a specific pressure by the expansion (elongation) and biasing force of the spring member 72 in a compressed state, such that the semiconductor substrate 5 is placed in contact with the abrasive pad 2. Consequently, the annular liquid storage space S, which is bounded (surrounded) by the abrasive pad 2 and the wall portion 7, is formed around the outer circumference of the semiconductor substrate 5 held by the retainer 3.

An auxiliary flange 73 projects horizontally from the inner circumferential surface of the wall portion 7. The terminal (leading) end (sealing lip) of the (annular) sealing member 8 extends around the entire outer-circumferential lower surface of the outer frame 35 of the retainer 3 and extends up to and abuts on the auxiliary flange 73 in a liquid-tight manner. Consequently, the liquid storage space S is enclosed from above by the annular sealing member 8.

The liquid distribution pipe 91 and the outside air distribution pipe 92 are inserted into the liquid storage space S from above and extend alongside the wall portion 71. A given amount of hydrofluoric acid is supplied as the polishing liquid L into the liquid storage space S via the liquid distribution pipe 91 during the substrate polishing operation. The polishing liquid L permeates or penetrates between the semiconductor substrate 5 and the abrasive pad 2 and, thus, the lower surface (surface to be polished) of the substrate 5 is chemically polished by the hydrofluoric acid. When polishing liquid is introduced into the liquid storage space S, air inside the liquid storage space S is exhausted or vented via the outside air distribution pipe 92.

After the completion of the polishing operation, the polishing liquid L is suctioned and recovered from the liquid storage space S via the liquid distribution pipe 91. Simultaneously, outside air is introduced via the outside air distribution pipe 92 into the liquid storage space S.

It should be noted that an optional changeover valve capable of switching the outside air distribution pipe 92 to a (the) negative-pressure source (e.g., a vacuum pump) may be provided, in order to subject the liquid storage space S to a (small) negative pressure during operation, whereby the polishing liquid L can be more reliably retained inside the liquid storage space S.

According to the exemplary substrate polishing apparatus described above, it is possible to supply only the minimum necessary amount of polishing liquid L into the liquid storage space S defined above the platen 1 around the outer circumference of the semiconductor substrate 5. In addition, the polishing liquid L within the liquid storage space S can be recovered and reused after the completion of the polishing operation. It is therefore possible to reduce or minimize the work required to supply and recover the polishing liquid L.

The present teachings are particularly effective when catalyst-assisted chemical polishing is performed using hydrofluoric acid or the like as the polishing liquid, because it is relatively expensive and harmful to humans. In particular, release of the polishing liquid L into the atmosphere can be effectively suppressed or prevented by enclosing the liquid storage space S with the sealing member 8 as was described in the present embodiment. Consequently, the ventilation apparatus may be simplified and significant cost savings may be achieved.

The above-described exemplary embodiment may be modified in various ways without departing from the spirit of the present invention. For example, the lower end of the wall portion 7 need not necessarily be brought into abutment with the abrasive pad 2. Instead, the lower end of the wall portion 7 may be positioned in sufficient proximity to the abrasive pad 2 so as to maintain liquid-tightness. In this case, the spring member 72 is not necessary and may be omitted. In another alternative, the wall portion 7 may be structured or configured so as to spin together with the retainer 3.

Naturally, the present teachings are not limited to polishing semiconductor substrates and may be used to polish a wide variety of substrates, in particular when a combination of chemical and mechanical polishing is required. Of course, the polishing liquid is not limited to hydrofluoric acid and, generally speaking, any type of suitable polishing liquid may be advantageously utilized with the present teachings.

Representative, non-limiting examples of the present invention were described above in detail with reference to the attached drawings. This detailed description is merely intended to teach a person of skill in the art further details for practicing preferred aspects of the present teachings and is not intended to limit the scope of the invention. Furthermore, each of the additional features and teachings disclosed above may be utilized separately or in conjunction with other features and teachings to provide improved substrate polishing devices and methods for manufacturing and using the same.

Moreover, combinations of features and steps disclosed in the above detailed description may not be necessary to practice the invention in the broadest sense, and are instead taught merely to particularly describe representative examples of the invention. Furthermore, various features of the above-described representative examples, as well as the various independent and dependent claims below, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

What is claimed is:

1. A substrate polishing apparatus comprising:
   a substrate supporting member for holding a substrate having a to-be-polished surface;
   substrate rotating means for spinning the substrate supporting member around a first rotational axis perpendicular to the to-be-polished surface of the substrate;
   a platen having a platen surface disposed opposite of the to-be-polished surface of the substrate;
   platen rotating means for spinning the platen around a second rotational axis perpendicular to the platen surface; and
   a liquid storage chamber including a wall portion surrounding an outer periphery of the substrate supporting member and overlapping the outer periphery of the substrate supporting member in the direction of the first rotational axis, one end of the wall portion configured to be positioned in a liquid-tight manner in abutment with or proximal to the platen surface to form a liquid storage space capable of retaining a polishing liquid around the outer periphery of the substrate.

2. The substrate polishing apparatus according to claim 1, wherein the liquid storage chamber includes a stationary axis supporting member for rotatably holding a spindle of the substrate rotation means, the stationary axis supporting member being integrally connected with the wall portion.

3. The substrate polishing apparatus according to claim 2, wherein the liquid storage chamber includes, and is defined in part by, a biasing member urging the one end of the wall portion into abutment on the platen surface at a constant pressure.

4. The substrate polishing apparatus according to claim 3, further comprising a sealing member enclosing the liquid storage space from above.

5. The substrate polishing apparatus according to claim 4, further comprising a liquid distribution pipe for supplying the polishing liquid into the liquid storage space and for recovering unused polishing liquid from the liquid storage space.

6. The substrate polishing apparatus according to claim 5, further comprising an abrasive pad disposed on the platen surface.

7. The substrate polishing apparatus according to claim 6, wherein the abrasive pad comprises a rubber pad with a platinum film on an upper surface thereof.

8. The substrate polishing apparatus according to claim 7, wherein the wall portion, the biasing member, the stationary axis supporting member and the platen surface define, at least in part, an air-tight enclosure around the to-be-polished surface of the substrate.

9. The substrate polishing apparatus according to claim 1, wherein the liquid storage chamber includes, and is defined in part by, a biasing member urging the one end of the wall portion into abutment on the platen surface at a constant pressure.

10. The substrate polishing apparatus according to claim 1, further comprising a sealing member enclosing the liquid storage space from above.

11. The substrate polishing apparatus according to claim 1, further comprising a liquid distribution pipe for supplying the polishing liquid into the liquid storage space and for recovering polishing liquid from the liquid storage space.

12. The substrate polishing apparatus according to claim 1, further comprising an abrasive pad disposed on the platen surface.

13. The substrate polishing apparatus according to claim 12, wherein the abrasive pad comprises a rubber pad with a platinum film on an upper surface thereof.

14. The apparatus according to claim 1, wherein the substrate supporting member includes a first portion overlapping the substrate in the direction of the first rotational axis and wherein the wall portion of the liquid storage chamber is radially spaced from the first portion of the substrate supporting member and overlaps the first portion of the substrate supporting member in the direction of the first rotational axis.

15. The substrate polishing apparatus according to claim 1, wherein the to-be-polished surface comprises an undersurface, and wherein the platen surface comprises a flat upper surface having a larger diameter than the to-be-polished surface.

16. An apparatus comprising:
   a substrate retainer configured to releasably retain a substrate having a to-be-polished surface, the substrate retainer being rotatable around a first rotational axis perpendicular to the to-be-polished surface;
   a platen having a platen surface disposed opposite of the to-be-polished surface of the substrate, the platen being rotatable around a second rotational axis perpendicular to the platen surface, the second rotational axis being parallel to and horizontally offset from the first rotational axis; and
   a liquid storage chamber disposed around the substrate retainer and overlapping the substrate retainer in the direction of the first rotational axis, and being defined in part by a wall portion that surrounds an outer periphery of the substrate, one end of the wall portion configured to be positioned in abutment with or proximal to the platen surface to form a liquid storage space capable of retaining a polishing liquid around the outer periphery of the substrate in a liquid-tight manner.

17. The apparatus according to claim 16, wherein the liquid storage chamber is further defined in part by a biasing member that urges the one end of the wall portion into abutment on the platen surface.

18. The apparatus according to claim 16, further comprising a sealing member disposed within liquid storage chamber and sealing the liquid storage space from above.

19. The apparatus according to claim 16, further comprising a liquid distribution pipe in fluid communication with the liquid storage space.

20. The apparatus according to claim 19, further comprising an abrasive pad adhered to the platen surface, the abrasive pad comprising a rubber pad with a platinum film on an upper surface thereof.

21. A method of polishing a substrate using the apparatus of claim 20, the method comprising:
placing the substrate into the substrate retainer,
introducing the polishing liquid into the liquid storage space via the liquid distribution pipe,
rotating the substrate retainer while rotating the platen with the abrasive pad in contact with the to-be-polished surface of the substrate, thereby polishing the substrate surface, and
removing the substrate from the substrate retainer upon completion of the polishing operation,
wherein the substrate is a semiconductor wafer.

22. The method according to claim 21, wherein:
the polishing liquid comprises hydrofluoric acid, and
the method further comprises, after the removing step, suctioning the polishing liquid out of the liquid storage space via the liquid distribution pipe.

23. The apparatus according to claim 16, wherein the substrate retainer includes a first portion overlapping the substrate in the direction of the first rotational axis and wherein the wall portion of the liquid storage chamber is radially spaced from the first portion of the substrate retainer and overlaps the substrate retainer in the direction of the first rotational axis.

24. A substrate polishing apparatus comprising:
a liquid retaining wall enclosing a first region;
a substrate supporting member for holding a substrate having a to-be-polished surface, a first portion of the substrate supporting member and the substrate being located in the first region, the substrate supporting member being configured for rotation around a first rotational axis perpendicular to the to-be-polished surface of the substrate; and
a platen having a platen surface disposed opposite of the to-be-polished surface of the substrate, the platen being configured for rotation around a second rotational axis perpendicular to the platen surface,
wherein a liquid storage chamber is defined in the first region by the liquid retaining wall and the platen and an outer periphery of the substrate supporting member, and
wherein the liquid retaining wall includes an end portion configured to be positioned in abutment with the platen surface in a liquid-tight manner or configured to be positioned proximal to the platen surface in a liquid-tight manner, the liquid storage chamber being configured to retain a polishing liquid around the outer periphery of the substrate.

* * * * *